United States Patent
Nabeta et al.

(10) Patent No.: US 10,879,661 B2
(45) Date of Patent: Dec. 29, 2020

(54) ULTRASONIC BONDING METHOD OF CONDUCTOR OF ELECTRIC WIRE, ULTRASONIC BONDING APPARATUS FOR CONDUCTOR OF ELECTRIC WIRE AND ELECTRIC WIRE

(71) Applicant: Yazaki Corporation, Tokyo (JP)

(72) Inventors: Yasunori Nabeta, Shizuoka (JP); Naoki Ito, Shizuoka (JP); Tomoya Sato, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 72 days.

(21) Appl. No.: 16/199,951

(22) Filed: Nov. 26, 2018

(65) Prior Publication Data

US 2019/0165533 A1 May 30, 2019

(30) Foreign Application Priority Data

Nov. 28, 2017 (JP) .................. 2017-227449

(51) Int. Cl.
| | |
|---|---|
| *B23K 20/10* | (2006.01) |
| *H01R 43/02* | (2006.01) |
| *B23K 20/00* | (2006.01) |
| *H01R 43/28* | (2006.01) |
| *B23K 101/38* | (2006.01) |
| *H01R 4/18* | (2006.01) |

(52) U.S. Cl.
CPC ....... *H01R 43/0207* (2013.01); *B23K 20/004* (2013.01); *B23K 20/10* (2013.01); *H01R 43/28* (2013.01); *B23K 2101/38* (2018.08); *H01L 2224/85205* (2013.01); *H01R 4/184* (2013.01)

(58) Field of Classification Search
CPC .... H01R 43/0207; H01R 43/28; H01R 4/184; B23K 20/10–106; B23K 20/004; B23K 2101/38; B23K 2101/32; B23K 2101/36; B23K 1/06; H01L 2224/85205
USPC ............... 228/1.1, 110.1, 180.5, 4.5, 904
See application file for complete search history.

(56) References Cited

U.S. PATENT DOCUMENTS

| | | | | |
|---|---|---|---|---|
| 4,867,370 A | * | 9/1989 | Welter ............... | B06B 3/00 228/110.1 |
| 7,459,653 B2 | * | 12/2008 | Steiner ............... | B23K 11/0026 219/56 |
| 2002/0074383 A1 | * | 6/2002 | Kondo ............... | B23K 37/0443 228/212 |
| 2004/0232208 A1 | * | 11/2004 | Kondo ............... | B23K 20/10 228/110.1 |
| 2006/0283912 A1 | * | 12/2006 | Eberach ............ | H01R 43/0207 228/101 |
| 2007/0257088 A1 | * | 11/2007 | Steiner .............. | H01L 24/85 228/110.1 |

(Continued)

FOREIGN PATENT DOCUMENTS

| | | | | |
|---|---|---|---|---|
| DE | 102004044480 A1 | * | 2/2006 | ......... H01R 43/0207 |
| JP | H10-175083 A | | 6/1998 | |

(Continued)

*Primary Examiner* — Kiley S Stoner
(74) *Attorney, Agent, or Firm* — Sughrue Mion, PLLC

(57) ABSTRACT

An ultrasonic bonding method of a conductor of an electric wire includes ultrasonically bonding strands forming a conductor of at least one electric wire using an anvil and horns. A first vibration mode of at least one of the horns is different from a second vibration mode of the other horns.

9 Claims, 11 Drawing Sheets

(56) References Cited

U.S. PATENT DOCUMENTS

| | | | | |
|---|---|---|---|---|
| 2010/0320257 A1* | 12/2010 | Buttiker | ................ | B23K 20/10 |
| | | | | 228/110.1 |
| 2011/0094797 A1* | 4/2011 | Otsuka | ................... | H01R 4/185 |
| | | | | 174/84 C |
| 2012/0298645 A1* | 11/2012 | Kleespiess | ............. | H01R 4/029 |
| | | | | 219/137 R |
| 2013/0233591 A1* | 9/2013 | Terasaka | ............. | H01B 7/0009 |
| | | | | 174/117 R |
| 2014/0374466 A1* | 12/2014 | Coto | ................... | B23K 20/106 |
| | | | | 228/102 |
| 2016/0067912 A1* | 3/2016 | Schneider | ........... | B29C 66/9513 |
| | | | | 156/580.2 |
| 2016/0294140 A1* | 10/2016 | Trube | ................... | B23K 20/106 |
| 2016/0336662 A1* | 11/2016 | Ooba | ....................... | H01R 4/34 |
| 2017/0331243 A1* | 11/2017 | Ootsuka | ................. | H01R 4/185 |

FOREIGN PATENT DOCUMENTS

| | | |
|---|---|---|
| JP | 2009-231079 A | 10/2009 |
| JP | 2010-218796 A | 9/2010 |

\* cited by examiner

ULTRASONIC BONDING METHOD OF CONDUCTOR OF ELECTRIC WIRE, ULTRASONIC BONDING APPARATUS FOR CONDUCTOR OF ELECTRIC WIRE AND ELECTRIC WIRE

CROSS REFERENCE TO RELATED APPLICATION

This application is based upon and claims the benefit of priority from the prior Japanese Patent Application No. 2017-227449, filed on Nov. 28, 2017, the entire contents of which are incorporated herein by reference.

BACKGROUND

1. Technical Field

The disclosure relates to an ultrasonic bonding method of a conductor of an electric wire and the like, and in particular, to a method of ultrasonically bonding a plurality of strands of a conductor using a plurality of horns.

2. Related Art

JP 2009-231079 A discloses a terminal-equipped electric wire 301 as shown in FIGS. 1 to 3C.

The terminal-equipped electric wire 301 is formed as follows. First, with respect to an electric wire 307 (see FIG. 3A), in which the sheath 303 is removed at one end portion and a conductor 305 (core wire) is exposed, the exposed tip portion of the conductor 305 is bonded by ultrasonic bonding (see FIG. 3B).

That is, respective strands 311 are ultrasonically bonded at the tip portion of the conductor 305 constituted by a plurality of strands 311 to form a bonded portion 309. A terminal-equipped electric wire 301 (see FIG. 3C) is provided by caulking a wire barrel 313 at the bonded portion 309 to install a terminal 315.

Here, the bonding of the strands 311 by a conventional ultrasonic bonding will be described with reference to FIGS. 4 and 5.

In the conventional ultrasonic bonding, while a plurality of strands 311 are sandwiched by a single anvil 317 and a single horn 319 with a predetermined pressure, the horn 319 is made to vibrate in the left-right direction in FIG. 4 (a direction orthogonal to the paper surface of FIG. 5).

SUMMARY

In the conventional ultrasonic bonding, the strands 311 that are aligned with the direction of the arrow A11 (the direction connecting the anvil 317 and the horn 319 to each other) in FIG. 5 are sufficiently bonded. That is, a predetermined pressure is applied between the strands 311 adjacent to each other along the direction of the arrow A11 in FIG. 5 by the anvil 317 and the horn 319, and the ultrasonic vibration propagates in the direction of the arrow A11, thereby ensuring sufficient bonding.

However, in the direction of the arrow A12 (the direction orthogonal to the arrow A11) in FIG. 5, since the strands 311 vibrate at the same timing, the strands 311 hardly slide to each other, the adjacent strands 311 are not bonded or bonded insufficiently even if boded.

In order to solve this problem, it is necessary to contrive the arrangement of the strands 311, which restrict the mode of the arrangement of the strands 311.

The disclosure is directed to an ultrasonic bonding method and the like for a conductor of an electric wire in which a plurality of strands constituting the conductor ca be reliably bonded to each other when ultrasonically bonding the strands.

An ultrasonic bonding method of a conductor of an electric wire in accordance with some embodiments includes ultrasonically bonding strands forming a conductor of at least one electric wire using an anvil and horns. A first vibration mode of at least one of the horns is different from a second vibration mode of the other horns.

The first vibration mode and the second vibration mode may be different from each other in at least one of a frequency, a phase, a waveform, or an amplitude.

The at least one electric wire may include electric wires, and the strands of the electric wires may be ultrasonically bonded to each other.

The horns may have respective conductor contact bodies in contact with the strands of the electric wire, the conductor contact bodies of the horns may be configured to vibrate with a single ultrasonic transducer, and at least one of the conductor contact bodies and the other conductor contact bodies may be different from each other in at least one of a material or a shape.

A method of manufacturing a terminal-equipped electric wire in accordance with some embodiments includes: by using the ultrasonic bonding method of a conductor of an electric wire according to claim 1, forming a bonded portion by bonding the conductor at a part of an exposed portion of the conductor in a longitudinal direction of the electric wire, the exposed portion at which the conductor is exposed due to absence of a sheath over a predetermined length at a part of the electric wire in the longitudinal direction; and after forming the bonded portion, installing a terminal with a wire barrel on an electric wire such that the wire barrel covers at least a part of the bonded portion with an end of the wire barrel on a sheath side of the electric wire being located closer to the sheath than an end of the bonded portion on the sheath side.

The longitudinal direction and a front-rear direction of the wire barrel may match with each other, and the bonded portion may be located inside the wire barrel in the front-rear direction.

An ultrasonic bonding apparatus for a conductor of an electric wire in accordance with some embodiments includes an anvil and horns. The ultrasonic bonding apparatus is configured to ultrasonically bond strands forming the conductor of the electric wire using the anvil and the horns. A vibration mode of at least one of the horns is different from a vibration mode of the other horns.

An electric wire in accordance with some embodiments includes: strands forming a conductor; and a bonded portion formed at least in a part of the strands in a longitudinal direction of the strands. A part of a surface of the bonded portion may include a first pressed portion, a second pressed portion, and a non-pressed portion between the first pressed portion and the second pressed portion.

According to the above configuration, when ultrasonically bonding the plurality of strands constituting a conductor to each other, it is possible to reliably bond the strands to each other.

DETAILED DESCRIPTION

Figure 1:
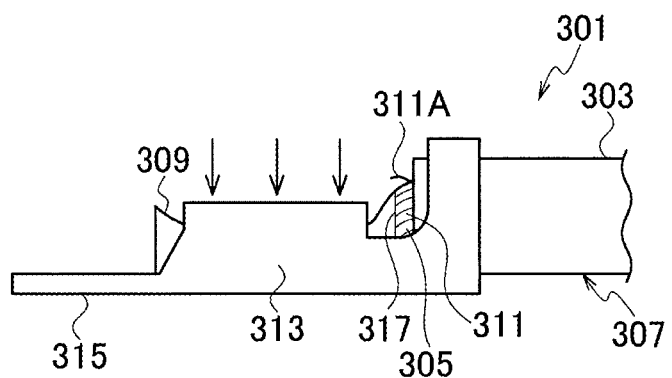
FIG. 1 is a view of a related terminal-equipped electric wire.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Description will be hereinbelow provided for an embodiment of the present invention by referring to the drawings. It should be noted that the same or similar parts and components throughout the drawings will be denoted by the same or similar reference signs, and that descriptions for such parts and components will be omitted or simplified. In addition, it should be noted that the drawings are schematic and therefore different from the actual ones.

An electric wire 1 obtained through an ultrasonic bonding method of a conductor of an electric wire according to an embodiment of the present invention will be described with reference to FIG. 10 and the like.

Here, for convenience of explanation, a longitudinal direction of the electric wire 1 is defined as a front-rear direction, a predetermined direction orthogonal to the front-rear direction is defined as a height direction, and a direction orthogonal to the longitudinal direction and the height direction is defined as the lateral direction. As will be described later, a predetermined direction in a terminal-equipped electric wire 101 is defined as a front-rear direction (a longitudinal direction of an electric wire 105), a predetermined direction orthogonal to the front-rear direction is defined as a height direction, and a direction orthogonal to the front-rear direction and the height direction (a height direction of the electric wire 105) is defined as a width direction (a lateral direction of the electric wire 105). In FIG. 6 and FIGS. 10 to 19, FRD, HD, TD, WD, FS and RS indicate the front-rear direction, the height direction, the lateral direction, the width direction, the front side, and the rear side, respectively.

A bonded portion 3 is formed on the electric wire 1. The bonded portion 3 is formed on at least part of an exposed conductor 5A of the electric wire 1 in the longitudinal direction. Further, the bonded portion 3 is formed such that a plurality of strands 7 (each strand is not shown in FIG. 10, see FIG. 6) constituting a conductor of the electric wire 1 is ultrasonically bonded (ultrasonic wave treatment). For example, in the bonded portion 3, the conductor 5 is made into a single wire.

The bonded portion 3 of the electric wire 1 is, for example, formed into a rectangular parallelepiped shape, and a first pressed portion 9 pressed by a first horn 15A used for ultrasonic bonding (for example, see FIG. 6) and a second pressed portion 11 pressed by a second horn 15B (for example, see FIG. 6) are formed on part of the surface of the bonded portion 3.

The second horn 15B is formed separately from the first horn 15A, has a different vibration mode from the first horn 15A, and is used in ultrasonic bonding at the same time as the first horn 15A is used.

In the electric wire 1, the first pressed portion 9 and the second pressed portion 11 are present, for example, slightly apart in the lateral direction of the electric wire 1, and a non pressed portion 13 which has not been pressed by either horn (the first horn 15A or the second horn 15B) is formed between the first pressed portion 9 and the second pressed portion 11.

The value of the width dimension of the non-pressed portion 13 (the dimension value in the lateral direction) is very small. Although not shown in FIG. 10, there are cases where the non-pressed portion 13 protrudes slightly from a planar portion of the first pressed portion 9 and the second pressed portion 11.

Note that three or more pressed portions may be provided, and two or more non-pressed portions partitioning each pressed portion may be provided.

Furthermore, since the bonded portion 3 is formed at the intermediate portion of the exposed conductor 5A in the longitudinal direction, although not shown, a plurality of unbonded strands 7 may extend from the front end to the front side of the bonded portion 3.

Figure 10:
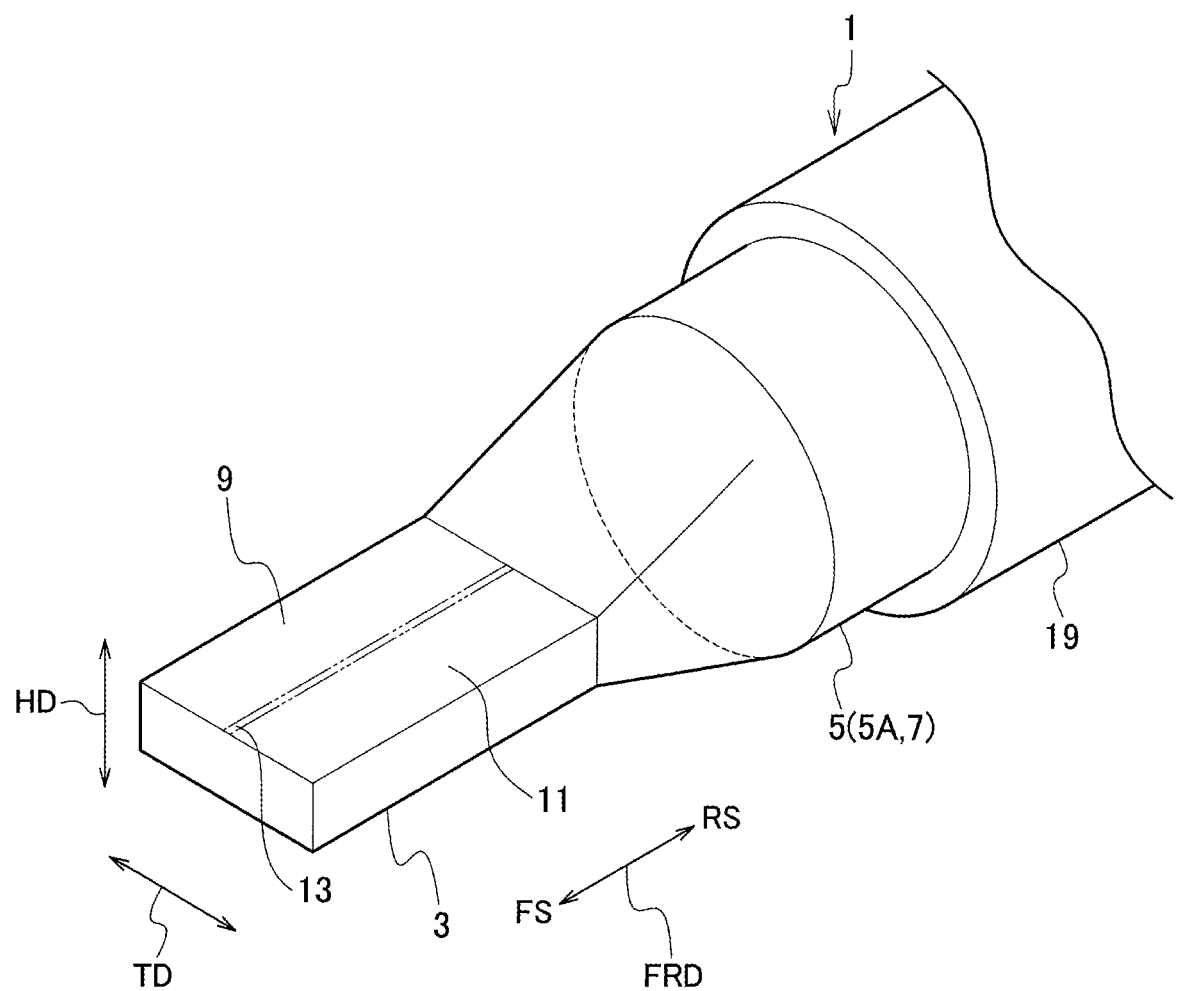
FIG. 10 is a perspective view of an electric wire generated by an ultrasonic bonding method of a conductor of an electric wire according to an embodiment of the present invention.

On the bonded portion 3 of the electric wire 1 shown in FIG. 10 the wire barrel of the terminal is installed (fixed), for example, in the same manner as in the case of a conventional terminal-equipped electric wire 301. Details of the terminal-equipped electric wire 101 (see FIG. 13 and the like) manufactured by installing a terminal on the electric wire 1 on which the bonded portion 3 is formed will be described later.

Next, an ultrasonic bonding method of the conductor 5 of the electric wire 1 according to the embodiment will be described.

Figure 6:
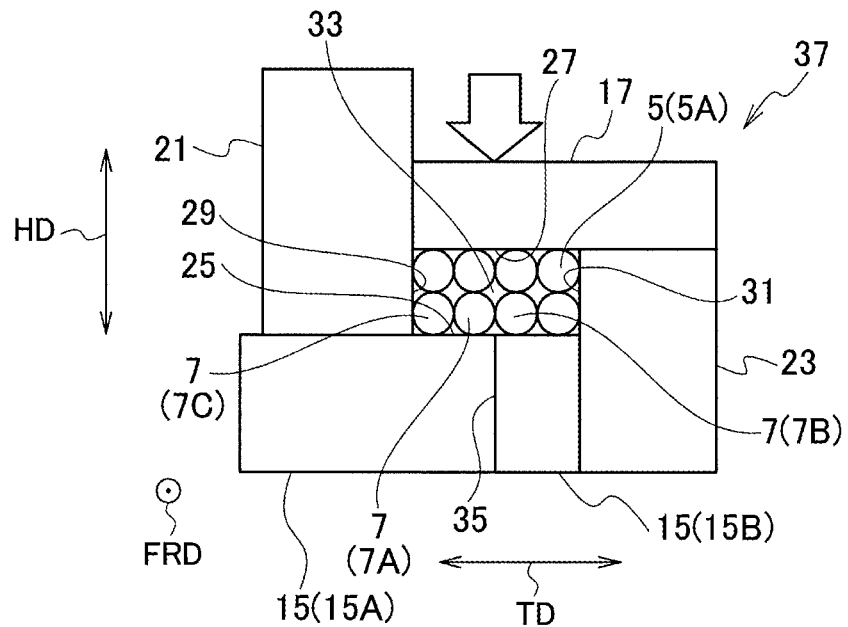
FIG. 6 is a diagram showing a schematic configuration of an ultrasonic bonding apparatus for a conductor used in an ultrasonic bonding method of a conductor of an electric wire according to an embodiment of the present invention.

As shown in FIG. 6, in the ultrasonic bonding method of the conductor 5 of the electric wire 1, the ultrasonic bonding is performed by ultrasonically bonding a plurality of strands 7 constituting the conductor 5 (core wire) of the electric wire 1 to each other using the horn 15(15A and 15B) and an anvil 17.

In the ultrasonic bonding method of the conductor 5 of the electric wire 1 according to the embodiment, a plurality of horns 15 (for example, the first horn 15A and the second horn 15B) are used. Each of the plurality of horn 15 is formed as a separate body, and they are present in a non-contact state.

The vibration mode of at least one of the horns 15 is different from the vibration mode of the other horns. For example, when two horns 15 are present, the vibration mode of the first horn 15A and the vibration mode of the second horn 15B are different from each other, for example, in order to ensure sufficient friction for bonding between the strands 7.

More specifically, the electric wire 1 includes the conductor 5 formed by collecting the plurality of strands 7 and a sheath 19 (insulator shown in FIG. 10) covering (sheathing) the conductor 5.

In addition, in the electric wire 1 before each of the strands 7 is ultrasonically bonded to each other, the conductor 5 is exposed over a predetermined length (the exposed conductor 5A is present) due to absence of a sheath at part (for example, one end portion) of the longitudinal direction (sheath 19 is removed).

The strands 7 of the conductor 5 are formed in an elongated columnar shape with a metal such as copper, aluminum, aluminum alloy or the like. The conductor 5 is configured in a form in which the plurality of strands 7 are twisted or in a form in which the plurality of strands 7 linearly extend in a lump.

Further, the electric wire 1 has flexibility. Further, a cross section (a cross section with a plane orthogonal to the front-rear direction) of a portion where the sheath 19 of the electric wire 1 is present is formed in a predetermined shape such as a circular shape.

The cross section of the conductor 5 at the portion of the electric wire 1 where the sheath 19 is present is, for example, formed in a substantially circular shape because the plurality of strands 7 are bundled with almost no gaps. The cross section of the sheath 19 at the portion of the electric wire 1 where the sheath 19 is present is, for example, formed in an annular shape having a predetermined width (thickness). The entire circumference of the inner periphery of the sheath 19 is in contact with the entire circumference of the outer periphery of the conductor 5.

As shown in FIG. 6, ultrasonic bonding of the strands 7 for forming the bonded portion 3 is performed using, for example, a grinding jaw 21, an anvil plate 23, the horn 15, and the anvil 17.

In order to facilitate understanding, first, ultrasonic bonding performed by using one grinding jaw 21, one anvil plate 23, one anvil 17, and one horn 15 (the first horn 15A and the second horn 15B are formed integrally) will be described in further detail.

Planes or planar portions 25, 27, 29, 31 (for example, planar portions having fine irregularities) are formed in the grinding jaw 21, the anvil plate 23, the horn 15, and the anvil 17 respectively.

A planar portion 29 of a grinding jaw 21 and a planar portion 31 of the anvil plate 23 are orthogonal to the lateral direction and face each other in parallel. The distance between the planar portion 29 of the grinding jaw 21 and the planar portion 31 of the anvil plate 23 is adjustable by moving and positioning at least one of the grinding jaw 21 and the anvil plate 23 in the lateral direction.

The planar portion 25 of the horn 15 and a planar portion 27 of the anvil 17 are orthogonal to the height direction and face each other in parallel. As already understood, the planar portion 29 of the grinding jaw 21 and the planar portion 31 of the anvil plate 23, and a planar portion 25 of the horn 15 and the planar portion 27 of the anvil 17 are orthogonal to each other.

The distance between the planar portion 25 of the horn 15 and the planar portion 27 of the anvil 17 is changed by moving at least one of the horn 15 and the anvil 17 in the height direction. For example, by moving the anvil 17 with respect to the horn 15 with a predetermined force using an actuator such as a pneumatic cylinder, the distance between the planar portion 25 of the horn 15 and the planar portion 27 of the anvil 17 is changed.

In addition, a square columnar space 33 is formed by the grinding jaw 21, the anvil plate 23, the horn 15 and the anvil 17, in which an opening is formed at both ends in the front-rear direction. The square columnar space 33 is surrounded by the planar portion 29 of the grinding jaw 21, the planar portion 31 of the anvil plate 23, the planar portion 25 of the horn 15, and the planar portion 27 of the anvil 17.

When ultrasonic bonding is performed, the exposed conductor 5A (exposed conductor) enters the square columnar space 33 so that the longitudinal direction of the strands 7 matches with a direction (front-rear direction) connecting a pair of openings of the square columnar space 33.

That is, when performing ultrasonic bonding, the exposed conductor 5A enters the square columnar space 33 so that the longitudinal direction of the strand 7 is parallel to the planar portion 29 of the grinding jaw 21, the planar portion 31 of the anvil plate 23, the planar portion 25 of the horn 15 and the planar portion 27 of the anvil 17.

With the strands 7 of the exposed conductor 5A entering into the square columnar space 33, the anvil 17 is moved toward the horn 15, the strands 7 are pressed by the anvil 17 and the horn 15, and the horn 15 is vibrated, so that the respective strands 7 are ultrasonically bonded. Ultrasonic bonding is performed between the strands 7 that have entered the square columnar space 33, so that the bonded portion 3 having a predetermined length is formed at part (for example, a tip portion) of the exposed conductor 5A in the longitudinal direction.

The vibration direction of the horn 15 at the time of ultrasonic bonding is, for example, the front-rear direction (the direction orthogonal to the paper surface of FIG. 6). Since the anvil 17 and the horn 15 press each strand 7, the planar portion 29 of the grinding jaw 21 and the planar portion 31 of the anvil plate 23 receive a pressing force from the strands 7.

Here, the case where the plurality of (for example, two) horns 15 are provided for one grinding jaw 21, one anvil plate 23, and one anvil 17 will be described.

In a mode in which two horns 15 are provided, the horn 15 described above is divided into two horn 15 (15A and 15B) by one plane 35 (dividing plane orthogonal to the lateral direction) parallel to the planar portion 29 of the grinding jaw 21 and the planar portion 31 of the anvil plate 23.

Note that practically, the two horns 15A and 15B are slightly away from each other in the lateral direction, and a slight gap is formed between the two horns 15A and 15B (at the dividing plane 35). Further, in the lateral direction, the dividing plane 35 is located between the planar portion 29 of the grinding jaw 21 and the planar portion 31 of the anvil plate 23.

In a mode in which three or more horns 15 are provided, a plurality of dividing planes 35 are present at a predetermined interval from each other.

Here, an example will be described in which the vibration modes of the horn 15 (15A and 15B) described above are different. In FIGS. 7 to 9C, the vertical axis represents amplitude Am and the horizontal axis represents time t.

In a mode in which the vibration mode of the first horn 15A and the vibration mode of the second horn 15B are different from each other, the first horn 15A and the second horn 15B are different in at least one of the frequency, the phase, the waveform, and the amplitude.

Figure 7:
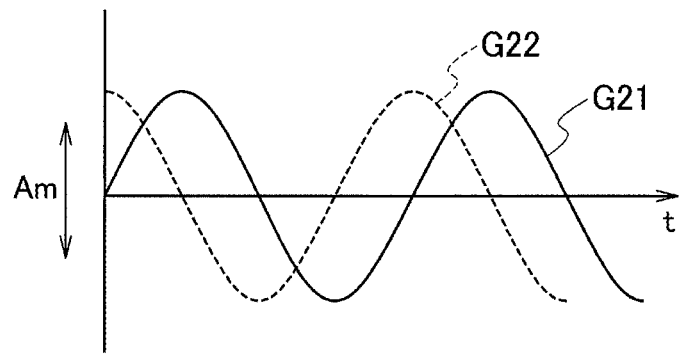
FIG. 7 is a view showing a first vibration mode of a horn used in an ultrasonic bonding method of a conductor of an electric wire according to an embodiment of the present invention.

For example, as shown in FIG. 7, the first horn 15A vibrates in the mode of diagram G21 and the second horn 15B vibrates in the mode of diagram G22. Both the diagrams G21 and G22 match with each other in their amplitudes and waveforms (sine waves or waveforms similar to sine waves), and differ only in phase.

Figure 8:
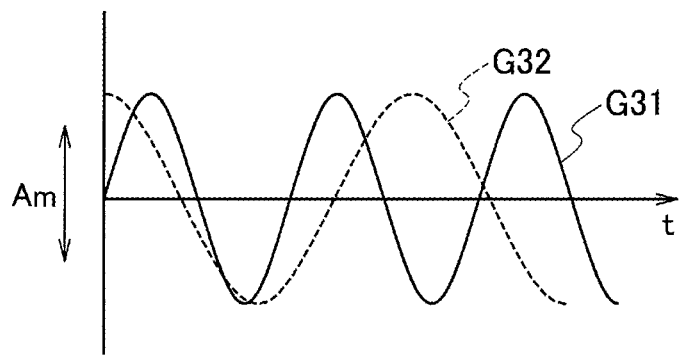
FIG. 8 is a view showing a second vibration mode of a horn used in an ultrasonic bonding method of a conductor of an electric wire according to an embodiment of the present invention.

Further, as shown in FIG. 8, the first horn 15A vibrates in the form of the diagram G31, and the second horn 15B vibrates in the mode of the diagram G32. The diagram G31 and the diagram G32 match with each other in amplitude and waveform (sine wave or waveform similar to a sine wave), and differ in only the frequency (period of the diagram G31<period of the diagram G32). It should be noted that the first horn 15A may vibrate in the mode of the diagram G32 and the second horn 15B may vibrate in the mode of the diagram G31.

Figure 9A:
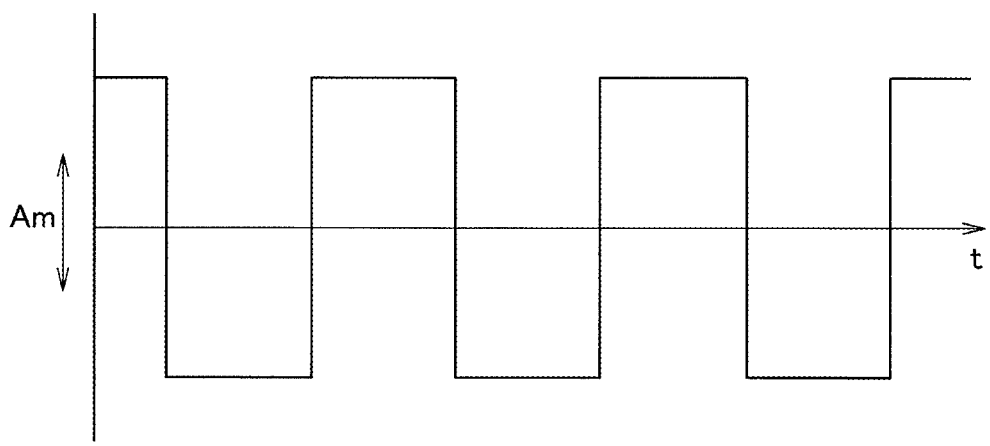
FIG. 9A is a view showing a third vibration mode of a horn used in an ultrasonic bonding method of a conductor of an electric wire according to an embodiment of the present invention.
Figure 9B:
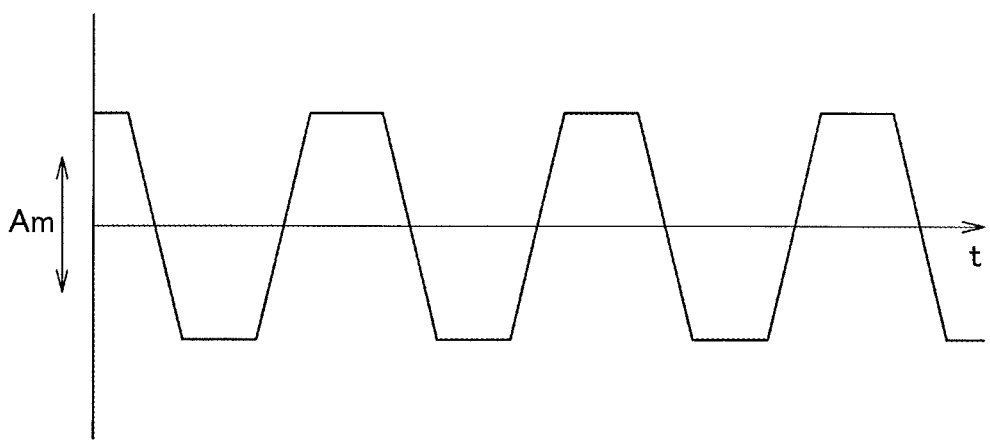
FIG. 9B is a view showing a fourth vibration mode of a horn used in an ultrasonic bonding method of a conductor of an electric wire according to an embodiment of the present invention.
Figure 9C:
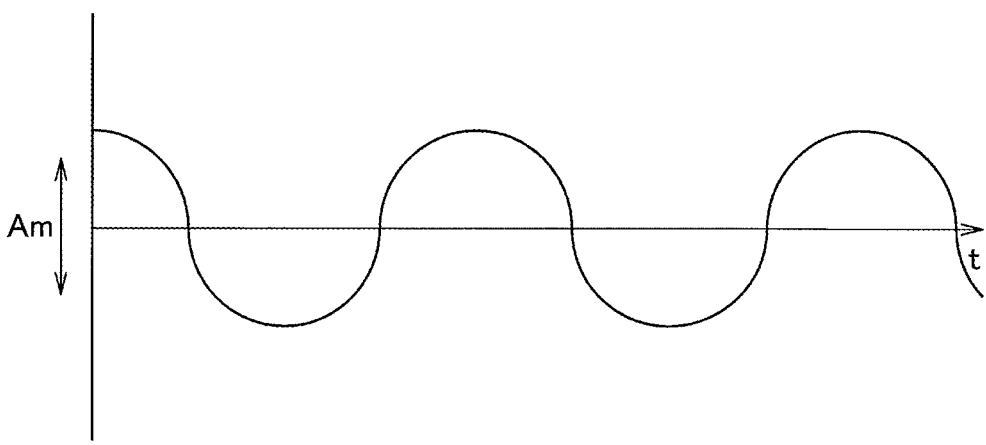
FIG. 9C is a view showing a fifth vibration mode of a horn used in an ultrasonic bonding method of a conductor of an electric wire according to an embodiment of the present invention.

Furthermore, instead of vibrating the horn 15 with a waveform other than a sine wave or a waveform similar thereto, the horn 15 may be vibrated with another waveform such as, for example, a rectangular wave as shown in FIG. 9A or a waveform similar thereto, or a trapezoidal waveform as shown in FIG. 9B or a waveform similar thereto, or a waveform of a shape connecting half arcs as shown in FIG. 9C or a waveform similar thereto, or a triangular wave (not shown) or a waveform similar thereto.

For example, the first horn 15A may be vibrated in the mode of diagram G21 and the second horn 15B may be vibrated in the mode of FIG. 9A.

Further, the first horn 15A and the second horn 15B may be vibrated in a mode in which the frequency, the phase, and the waveform match and only the amplitudes differ.

Further, by combining at least two or more of the frequency, the phase, the waveform, and the amplitude, the modes of vibration of the first horn 15A and the second horn 15B may be changed.

Also, when the horn 15 is divided into three or more horns 15, each of the three horns 15 may be vibrated in different modes. Also, one horn 15 of the three horns 15 may be vibrated in a mode different from those of the other two horns 15. In this case, the forms of vibration of the two horns 15 located at both ends in the lateral direction of the three horns 15 match with each other, and the form of vibration of the horn 15 located in the middle in the lateral direction is different from the forms of vibration of the two horns 15 located at both end portions in the lateral direction.

That is, in the case where the horn 15 is divided into three or more, the vibration modes of the adjacent horns 15 are different from each other in order to increase the degree of bonding between the strands 7.

Next, an ultrasonic bonding apparatus 37 for the conductor 5 of the electric wire 1 will be described.

The ultrasonic bonding method of the conductor 5 of the electric wire 1 described above is implemented by using the ultrasonic bonding apparatus 37 (see FIG. 6) for the conductor 5 of the electric wire 1, for example.

The ultrasonic bonding apparatus 37 (conductor bonding apparatus) for the conductor 5 of the electric wire ultrasonically bonds the plurality of strands 7 constituting the conductor 5 of the electric wire 1 by using the anvil 17 and the horn 15.

The bonding apparatus 37 for a conductor is provided with the plurality of horns 15 (15A and 15B). As described above, each of the plurality of horns 15A and 15B is formed as a separate body, and they are present in a non-contact state. The ultrasonic bonding of the plurality of strands 7 is performed in a mode in which the vibration mode of at least one horn 15A of the horns 15A and 15B is different from the vibration mode of the other horn 15B.

According to the ultrasonic bonding method of the conductor 5 of the electric wire 1, since the vibration modes of the respective horns 15A and 15B are different from each other, irrespective of the arrangement form of the plurality of strands 7 (the arrangement form of the respective strands 7 does not matter), the strands 7 that are in contact with each other rub against each other and sufficient sliding occurs between the strands 7, so that the strands 7 can be precisely bonded to each other.

For example, in the mode shown in FIG. 6, a strand 7A and a strand 7B, which are in contact with each other in the lateral direction, since the vibration mode of the horn 15B is different from the vibration mode of the horn 15A, sufficient sliding occurs between the strand 7A and the strand 7B, so that it is possible to reliably bond the strands 7 to each other.

Even if the strand 7A and a strand 7C are stuck in the lateral direction at the first horn 15A, the vibration of the horn 15B (strand 7B) affects them, so that the strand 7A and the strand 7C are sufficiently bonded to each other.

Further, according to the ultrasonic bonding method of the conductor 5 of the electric wire 1, since the horn 15A and the horn 15B are different in either the frequency or the phase, it is possible to obtain a slide between the strand 7A and the strand 7B arranged in contact in the lateral direction (a direction orthogonal to the pressing direction by the horn 15 and the anvil 17) with a simple configuration. For example, the plurality of horns 15 having the same specification can be used.

Figure 20A:
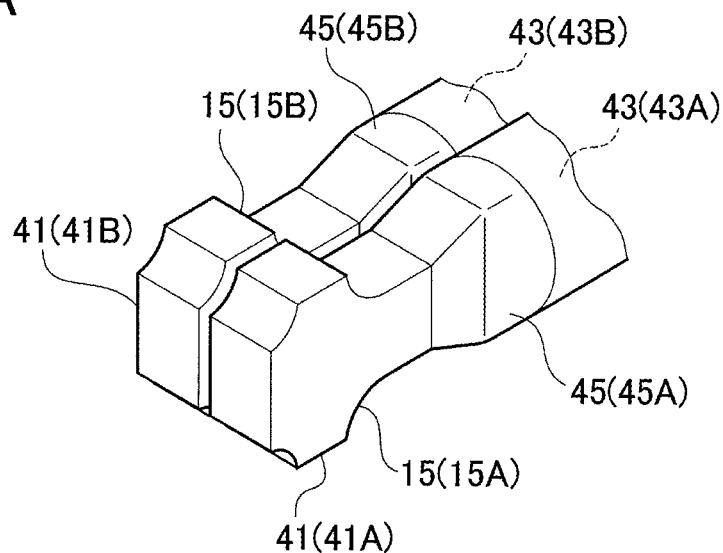
FIGS. 20A to 20C are views of horns used in ultrasonic bonding.

In the above explanation, as shown in FIG. 20A, the horn 15A and the horn 15B are configured as separate bodies.

Here, a mode in which the horn 15A and the horn 15B are configured as separate bodies will be described in further detail with reference to FIG. 20A. The horn 15A includes a conductor contact body 41 (41A), an ultrasonic transducer 43 (43A), and a conductor contact body support member 45 (45A).

The conductor contact body 41A comes into contact with the strand 7 of the electric wire 1 when forming the bonded portion 3 on the conductor 5. The conductor contact body support member 45A supports the conductor contact body 41A. The ultrasonic transducer 43A is provided on the conductor contact body support member 45A, and the conductor contact body 41A performs ultrasonic vibration by the ultrasonic transducer 43A.

As in the horn 15A, the horn 15B includes the conductor contact body 41 (41B), an ultrasonic transducer (43B), and a conductor contact body support member 45 (45B). Also, the horn 15A and the horn 15B are slightly away from each other.

Then, the horn 15A (the conductor contact body 41A) and the horn 15B (the conductor contact body 418) vibrate in mutually different modes.

Figure 20B:
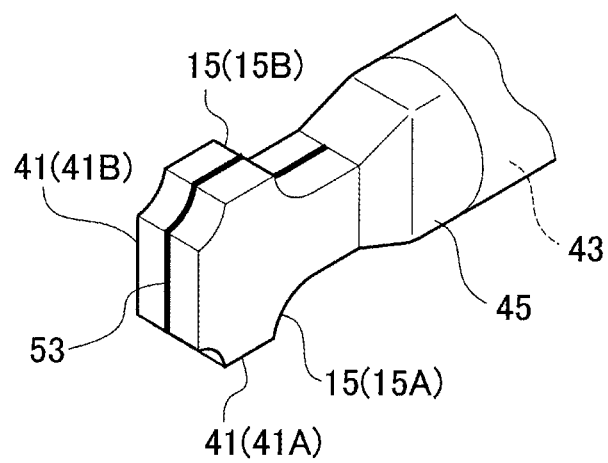

As shown in FIG. 20B, a plurality of conductor contact bodies 41 (for example, two conductor contact bodies 41A and 41B) may be ultrasonically vibrated by one ultrasonic transducer 43.

At least one of the material and the shape of at least one conductor contact body 41 (41A) of conductor contact bodies 41 differs from that of the other conductor contact body 41 (41B) of the conductor contact bodies 41, and the vibration modes of the conductor contact bodies 41 may be different from each other.

By way of example, the material of the first conductor contact body 41A is different from the material of the second conductor contact body 41B, so that the vibration mode of the first conductor contact body 41A may be different from the vibration mode of the second conductor contact body 41B.

In addition, the shape of the first conductor contact body 41A is different from the shape of the second conductor contact body 41B, so that the vibration mode of the first conductor contact body 41A may be different from the vibration mode of the second conductor contact body 418. The material and shape of the first conductor contact body 41A is different from the material and shape of the second conductor contact body 41B, so that the vibration mode of the first conductor contact body 41A may be different from the vibration mode of the second conductor contact body 413.

In FIG. 20B, the shape of the first conductor contact body 41A and the shape of the second conductor contact body 41B match with each other, and the material of the first conductor contact body 41A differs from the material of the second conductor contact body 41B.

The horn shown in FIG. 20B will be described in more detail. For the horn shown in FIG. 20B, for example, a slit 53 (notch) is provided in the conductor contact body 41 of one horn 15 (the horn 15A shown in FIG. 20A or the horn 15B shown in FIG. 20A), whereby the conductor contact body 41A and the conductor contact body 413 are configured. The conductor contact body 41A and the conductor contact body 41B are not in direct contact with each other. They are integrally supported by one conductor contact body support member 45, so that they are integrated with each other. That is, one conductor contact body 41A and one conductor contact body 41B are supported via one conductor contact body support member 45, and one conductor contact body 41A, one conductor contact body 41B, and one conductor contact body support member 45 are integrated.

Then, one ultrasonic transducer 43 ultrasonically vibrates, whereby the conductor contact body 41A and the conductor contact body 41B ultrasonically vibrate in mutually different modes.

The conductor contact body 41A and the conductor contact body 41B are detachable with respect to the conductor contact body support member 45, and the shape and the material of the conductor contact body 41A and the conductor contact body 413 may be easily changed. Then, when forming the bonded portion 3, the conductor contact body 41A and the conductor contact body 41B may be exchanged as appropriate according to the form of the strand 7 constituting the bonded portion 3 or the like.

Figure 20C:
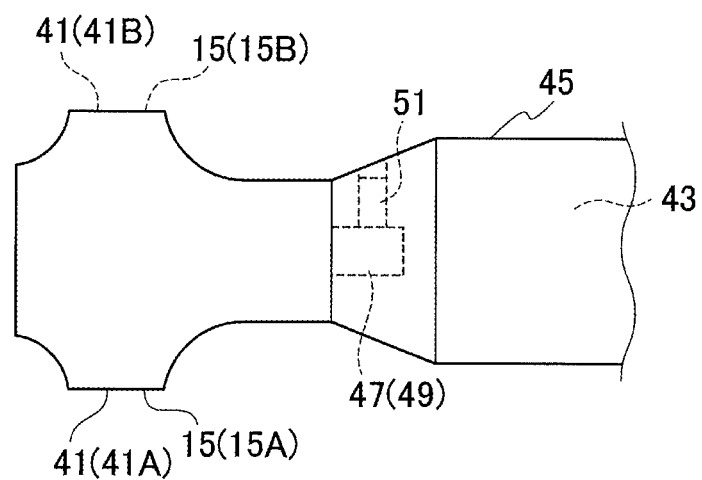

A configuration in which the conductor contact body 41A (conductor contact body 41B) is detachable from the conductor contact body support member 45 will be described with reference to FIG. 20C. FIG. 20C is a side view of FIG. 20B.

The conductor contact body 41A (the conductor contact body 41B) has a fitting projection 47, and the conductor contact body support member 45 has a fitting recess 49 (two fitting recesses). Then, in a state in which the fitting projection 47 is inserted and fitted in the fitting recess 49, by further fixing the conductor contact body 41A (the conductor contact body 41B) with a fixing member 51 (for example, set screw), so that the conductor contact body 41A (the conductor contact body 41B) is integrally installed on the conductor contact body support member 45.

The horn in FIG. 20B has two conductor contact bodies 41 by providing one slit 53. Three or more conductor contact bodies 41 may be formed by providing two or more slits 53.

As shown in FIG. 20B, by vibrating a plurality of conductor contact bodies 41 with one ultrasonic transducer 43, it is possible to reduce the size of the horn 15, and even the small bonded portion 3 can serve a function.

Next, with reference to FIGS. 11 to 17, the terminal-equipped electric wire 101 will be described in detail.

Figure 11:
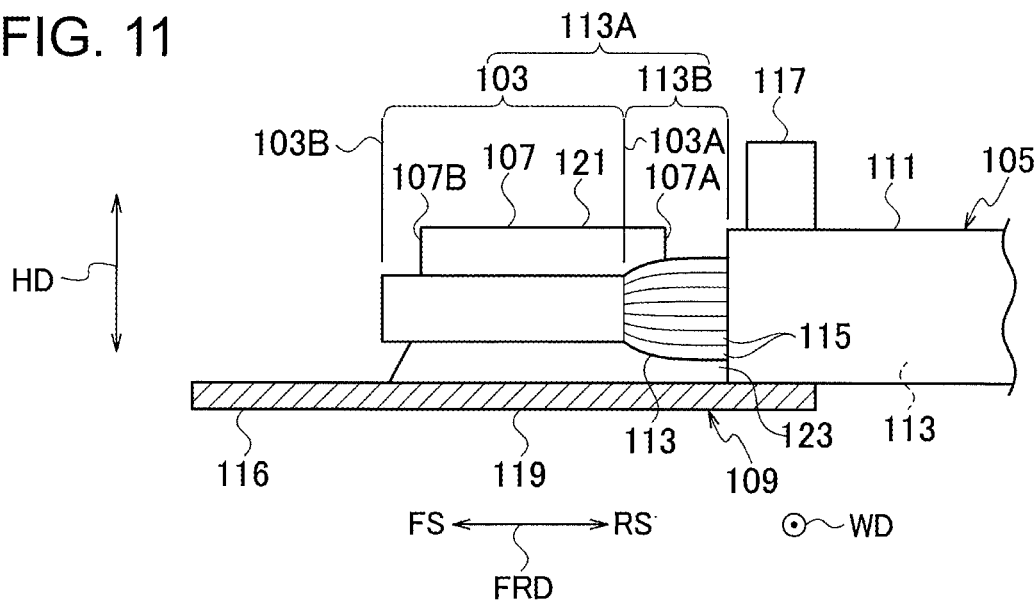
FIG. 11 is a view of a terminal-equipped electric wire to be manufactured by installing a terminal on an electric wire having a bonded portion formed by an ultrasonic bonding method of a conductor of an electric wire according to an embodiment of the present invention and shows a state before the terminal is installed on the electric wire.
Figure 12:
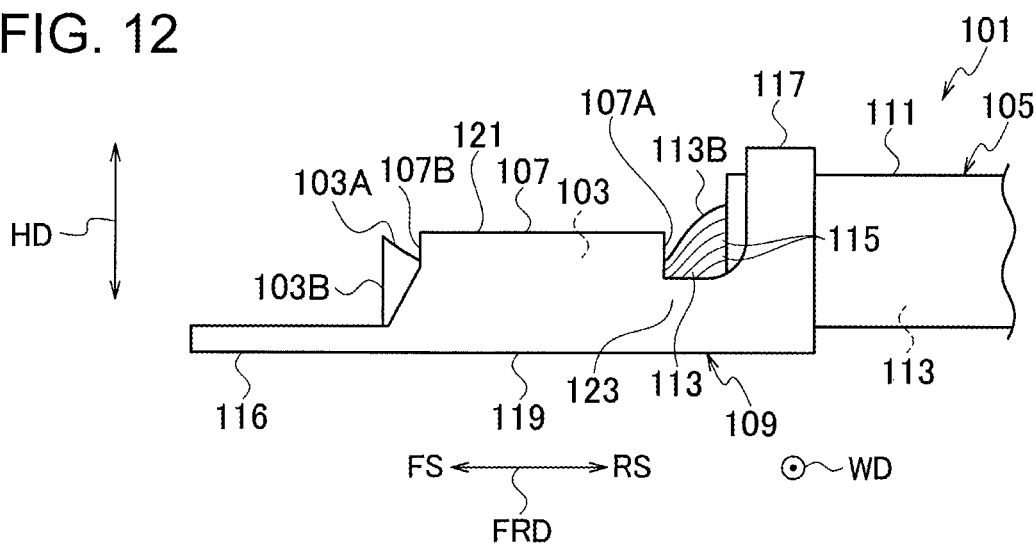
FIG. 12 is a view showing a schematic configuration of a terminal-equipped electric wire which has been manufactured by installing a terminal on an electric wire having a bonded portion formed by an ultrasonic bonding method of a conductor of an electric wire according to an embodiment of the present invention.
Figure 13:
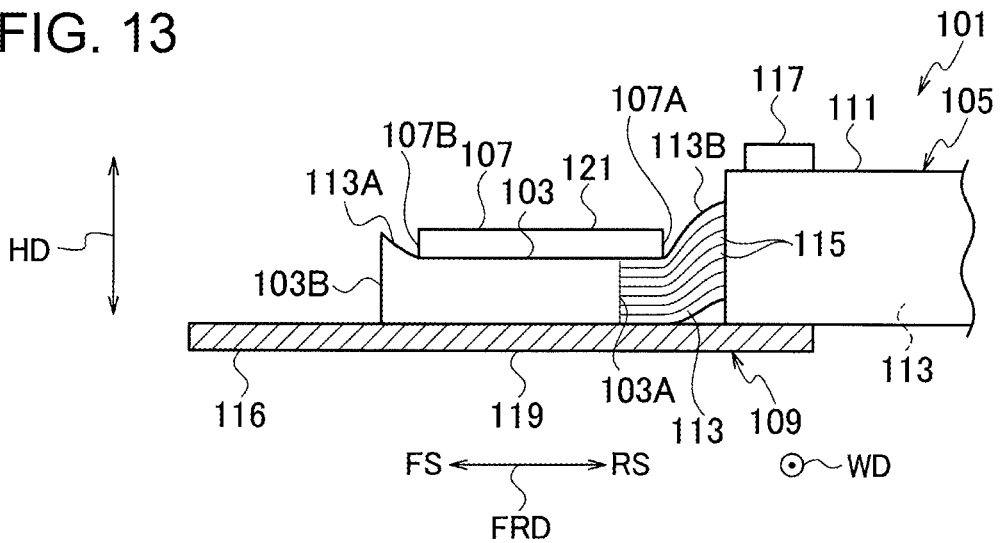
FIG. 13 is a cross-sectional view showing a schematic configuration of a terminal-equipped electric wire t which has been manufactured by installing a terminal on an electric wire having a bonded portion formed by an ultrasonic bonding method of a conductor of an electric wire according to an embodiment of the present invention.

As shown in FIGS. 11 to 13, the terminal-equipped electric wire 101 includes the electric wire 105 (electric wire 1) on which a bonded portion 103 (bonded portion 3) is formed, and a terminal 109 (terminal fitting) having the wire barrel 107.

Here, for convenience of explanation, a predetermined direction in the terminal-equipped electric wire 101 is defined the front-rear direction (a longitudinal direction of the electric wire 105), a predetermined direction orthogonal to the front-rear direction is defined the height direction, and a direction orthogonal to the front-rear direction and the height direction (the height direction of the electric wire 105) is defined as the width direction (the lateral direction of the electric wire 105).

As described above, a conductor 113 (conductor 5) is exposed due to absence of a sheath 111 (sheath 19) over a predetermined length at part (for example, one end portion) of the electric wire 105 in the longitudinal direction (length direction) (for example, part of the sheath 111 is removed).

The bonded portion 103 to which the conductor 113 is bonded is formed over a predetermined length at part of the exposed conductor 113A (exposed conductor) of the electric wire 105. The bonded portion 103 is formed by, for example, ultrasonically bonding a plurality of strands 115 (strands 7) constituting the conductor 113.

More specifically, the electric wire 105 includes a conductor 113 (core wire) formed by collecting a plurality of strands 115 and a sheath 111 (insulator) covering (sheathing) the conductor 113.

The strands 115 of the conductor 113 are formed in an elongated columnar shape with a metal such as copper, aluminum, aluminum alloy or the like. The conductor 113 is configured in a form in which a plurality of strands 115 are twisted or in a form in which a plurality of strands 115 linearly extend in a lump.

Further, the electric wire 105 has flexibility. A cross section (a cross section which is a plane orthogonal to the longitudinal direction) of a portion of the electric wire 105 where the sheath 111 is present is formed in a predetermined shape such as a circular shape.

The cross section of the conductor 113 at the portion of the electric wire 105 where the sheath 111 is present is, for example, formed in a substantially circular shape because the plurality of strands 115 are bundled with almost no gaps. The cross section of the sheath 111 at the portion of the electric wire 105 where the sheath 111 is present is, for example, formed in an annular shape having a predetermined width (thickness). The entire circumference of the inner periphery of the sheath 111 is in contact with the entire circumference of the outer periphery of the conductor 113.

In the bonded portion 103, the plurality of strands 115 constituting the conductor 113 are ultrasonically bonded to each other as described above, whereby the conductor 113 is bonded.

In the above description, the bonded portion 103 is formed by the ultrasonic bonding. The bonded portion 103 may be formed by bonding the strands 115 by a bonding method other than ultrasonic bonding. For example, the strands 115 may be metallurgically bonded to each other at a temperature equal to or lower than the recrystallization temperature of the strand 115, whereby the bonded portion 103 may be formed in the same manner as in the case of the ultrasonic bonding.

Further, the bonded portion 103 may be formed by a process other than ultrasonic wave treatment, such as cold welding, friction stir welding, friction pressure welding, electromagnetic pressure welding, diffusion bonding, brazing, soldering, resistance welding, electron beam welding, laser welding, light beam welding or the like.

The bonded portion 103 and the sheath 111 are away from each other by a predetermined length in the longitudinal direction of the electric wire 105, for example. As a result, a plurality of strands 113B (conductors in a non-bonded state) which is in contact with each other, but is in a non-bonded state is exposed between the bonded portion 103 and the sheath 111.

That is, the bonded portion 103 having a predetermined length, the conductor 113B in a non-bonded state, and the conductor 113 covered with the sheath 111 (a portion of the electric wire 105 where the sheath 111 is present) are arranged in this order from the one end toward the other end of the electric wire 105 in the longitudinal direction.

The cross-sectional shape (sectional shape represented by a plane orthogonal to the longitudinal direction) of the bonded portion 103 before the terminal 109 is installed is formed in a predetermined shape such as a rectangular shape.

In addition, the cross-sectional shape (cross-sectional shape represented by a plane orthogonal to the longitudinal direction) of the conductor 113B in a non-bonded state before the terminal 109 is installed, gradually shifts from the sectional shape of the bonded portion 103 to the cross-sectional shape of the conductor 113 covered with the sheath 111.

In the terminal-equipped electric wire 101, the longitudinal direction of the electric wire 105 and the conductor 113, and the front-rear direction of the wire barrel 107 (the terminal 109) match with each other. One end of the electric wire 105 in the longitudinal direction is located on the front side, and the other end of the electric wire 105 in the longitudinal direction is located on the rear side.

Further, in the terminal-equipped electric wire 101, an end 107A (rear end: the end located on the sheath 111 side in the front-rear direction) of the wire barrel 107 of the terminal 109 is located on the sheath 111 side (rear side) relative to the end 103A (rear end; end located on the sheath 111 side in the longitudinal direction) of the bonded portion 103. In the terminal-equipped electric wire 101, for example, by caulking the wire barrel 107 the wire barrel 107 wraps and covers at least part of the bonded portion 103. By the caulking, almost the entire inner surface of the cylinder of the wire barrel 107 is in contact with the bonded portion 103 with an urging force.

The terminal 109 is formed, for example, by forming a flat metal material in a predetermined shape and then folding the terminal formed in the predetermined shape.

For example, a terminal connection portion 116 connected to the mating terminal, the wire barrel 107 and an insulation barrel portion 117 are arranged in this order from the front side to the rear side of the terminal 109.

For example, the sectional shape of the wire barrel 107 (the cross-sectional shape represented by a plane orthogonal to the front-rear direction) before being caulked is, for example, formed in a U-shape with a bottom plate portion 119 (arc-shaped bottom plate portion) in which the thickness direction is substantially the height direction, and a pair of side plate portions 121. Each of the pair of side plate portions 121 stands obliquely upward from both ends of the bottom plate portion 119 in the width direction. The dimension value (dimension value in the width direction) between the pair of side plate portions 121 gradually increases from the lower side to the upper side.

The sectional shape of the insulation barrel portion 117 before being caulked (the sectional shape represented by a plane orthogonal to the front-rear direction) is also formed in a U-shape similar to the cross section of the wire barrel 107.

In the terminal-equipped electric wire 101, as the wire barrel 107 is caulked, the bonded portion 103 and the wire barrel 107 are integrated with each other, and as the insulation barrel portion 117 is caulked, the sheath 111 and the insulation barrel portion 117 are integrated with each other.

The caulking of the wire barrel 107 and the insulation barrel portion 117 is mainly performed by plastically deforming the pair of side plate portions 121 and making the wire barrel 107 and the insulation barrel portion 117 into a cylindrical shape. By caulking the wire barrel 107, the bonded portion 103 is deformed.

Further, in the front-rear direction, for example, the wire barrel 107 and the insulation barrel portion 117 are slightly away from each other (a connection portion 123 is provided therebetween). The wire barrel 107 may be in contact with the insulation barrel portion 117.

Here, the relationship between the electric wire 105 and the terminal 109 in the front-rear direction will be described in more detail.

In the longitudinal direction of the electric wire 105, as described above, from the front side to the rear side, the bonded portion 103 having a predetermined length, the conductor 113B in a non-bonded state, and the conductor 113 covered with the sheath 111 are arranged in this order. The length of the conductor 113 covered with the sheath 111 is much longer than the length of the bonded portion 103 or the conductor 113B in the non-bonded state.

In the front-rear direction of the terminal 109, as described above, from the front side to the rear side, the terminal connection portion 116, the wire barrel 107, the connection portion 123 between the wire barrel 107 and the insulation barrel portion 117, and the insulation barrel portion 117 are arranged in this order. The dimension value of the wire barrel 107 in the front-rear direction is larger than the dimension value of the connection portion 123 and the insulation barrel portion 117 in the front-rear direction.

In the terminal-equipped electric wire 101, as shown in FIG. 13 etc., in the front-rear direction, one end 103B (front end) of the bonded portion 103 is located slightly on the front side relative to the front end 107B of the wire barrel 107. Thus, one end portion of the bonded portion 103 protrudes slightly forward from the front end 107B of the wire barrel 107. The value of the protrusion dimension of the bonded portion 103 from the wire barrel 107 (protrusion amount toward the front side) is smaller than the value of the height dimension of the bonded portion 103.

One end 1033 (front end) of the bonded portion 103 may be located slightly on the rear side relative to the front end 107B of the wire barrel 107.

The other end 103A (rear end) of the bonded portion 103 is located slightly on the front side relative to the rear end 107A of the wire barrel 107. As a result, the wire barrel 107 encapsulates the front end portion of the conductor 113B in the non-bonded state between the bonded portion 103 and the sheath 111.

The dimension value (the dimension value in the front-rear direction) between the rear end 103A of the bonded portion 103 and the rear end 107A of the wire barrel 107 is also smaller than the value of the height dimension of the bonded portion 103.

In the terminal-equipped electric wire 101, the value of the height dimension of the conductor 1133 in the non-bonded state gradually increases from the front side to the rear side. The front end (the rear end of the conductor 113B in the non-bonded state) of the sheath 111 of the electric wire 105 is located slightly on the front side relative to the front end of the insulation barrel portion 117.

Here, a method of manufacturing the terminal-equipped electric wire 101 will be described. The terminal-equipped electric wire 101 is manufactured through a bonded portion forming process and a terminal installing (fixing) process.

In the bonded portion forming process, the conductor 113 is bonded at part of the exposed conductor 113A in the longitudinal direction to form the bonded portion 103.

Subsequently, after forming the bonded portion 103 in the bonded portion forming process, as shown in FIG. 11, the electric wire 105 is positioned with respect to the terminal 109.

Subsequently, in the terminal installing process, the wire barrel 107 and the insulation barrel portion 117 are caulked to install the terminal 109 on the electric wire 105. At this time, the rear end 107A of the wire barrel 107 is located on the rear side relative to the rear end 103A of the bonded portion 103, and the wire barrel 107 wraps and covers at least part of the bonded portion 103.

According to the terminal-equipped electric wire 101, since the wire barrel 107 covers the bonded portion 103 so that the rear end 107A of the wire barrel 107 is located on the rear side relative to the rear end 103A of the bonded portion 103, it is possible to suppress cut of the strand 115 at the boundary portion 103A (boundary between the bonded portion 3 and the conductor 113B in the non-bonded state) of the bonded portion 103.

Figure 2:
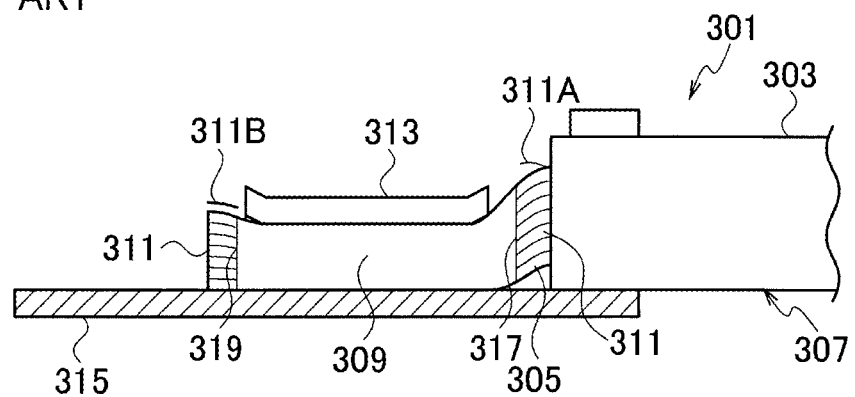
FIG. 2 is a view of a related terminal-equipped electric wire.
Figure 3A:
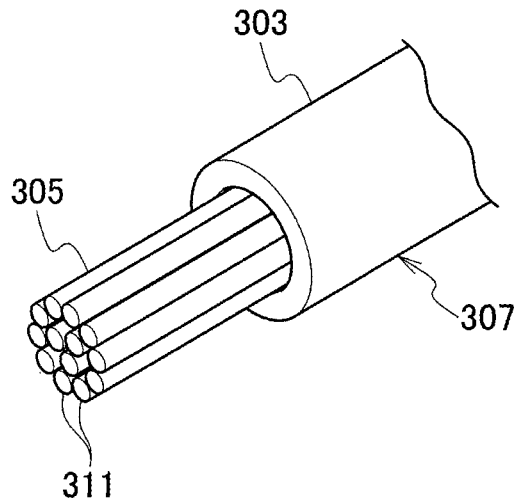
FIGS. 3A to 3C are views of a related terminal-equipped electric wire.
Figure 3B:
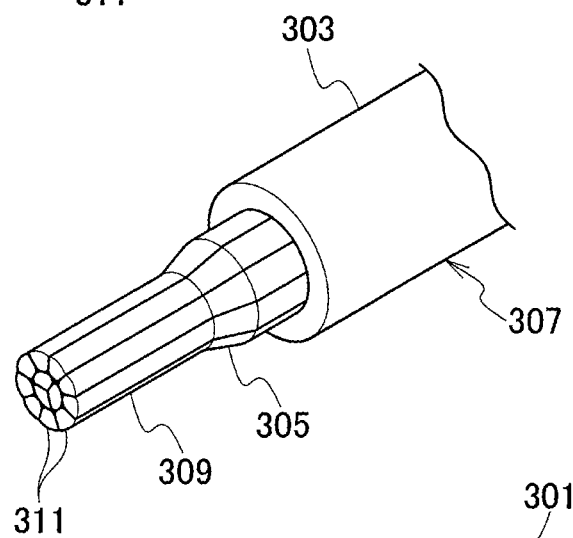
Figure 3C:
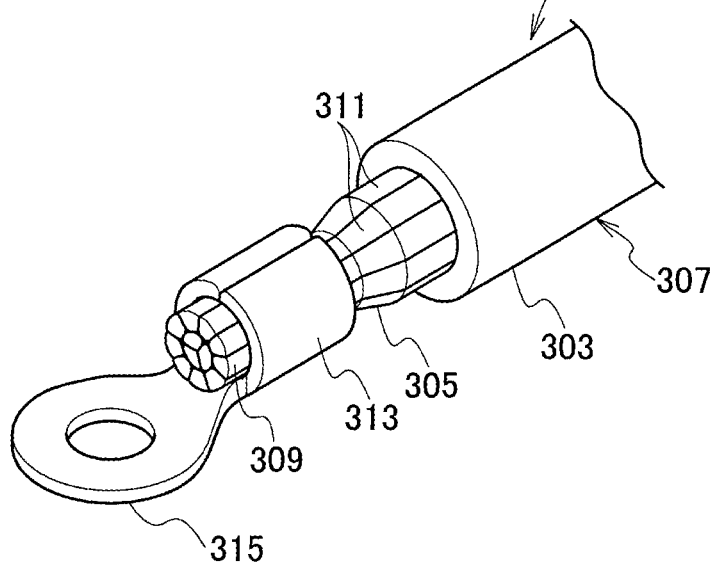
Figure 4:
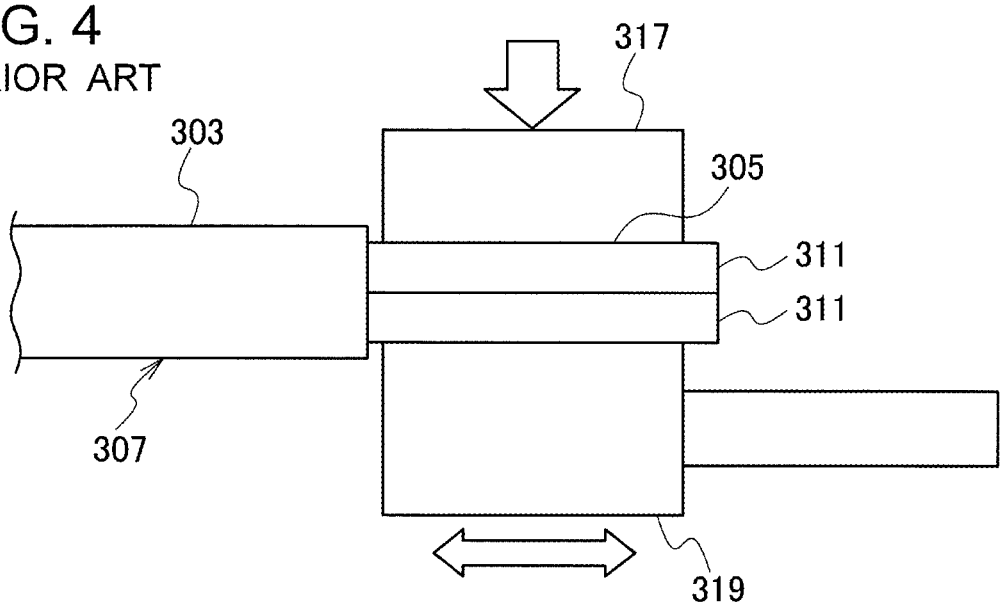
FIG. 4 is a view showing a conventional ultrasonic bonding method of a conductor.
Figure 5:
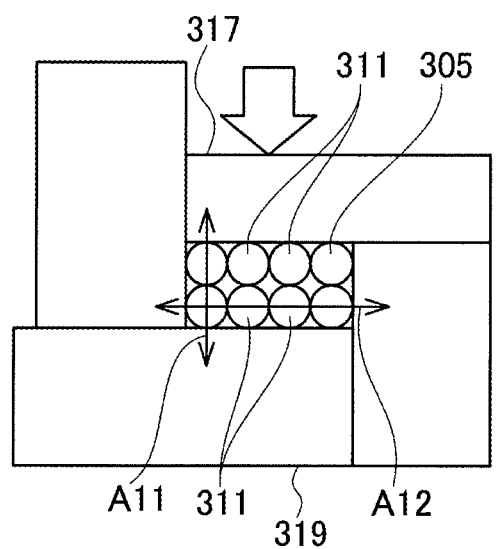
FIG. 5 is a view showing a conventional ultrasonic bonding method of a conductor.

That is, when caulking the wire barrel 107 to the electric wire 105 forming the bonded portion 103 and crimping the terminal 109, the rear end 103A (boundary portion between the bonded portion and the conductor in the non-bonded state) of the bonded portion 103 is located within the wire barrel 107. Thus, the boundary portion 103A is hardly pulled by the crimping of the terminal 109, so that it is possible to suppress cut of the core wire at the boundary portion 103A (cut of the strands 115 even in the non-bonded state conductor 113B; cut of the strands indicated by reference numerals 311A and 311B in FIGS. 19 and 2).

By suppressing cut of the strand 115, the performance of the crimping part is stabilized (the degree of mechanical bonding and the degree of electrical bonding between the electric wire 105 and the terminal 109 are stabilized), and the occurrence of contamination is suppressed.

Figure 14:
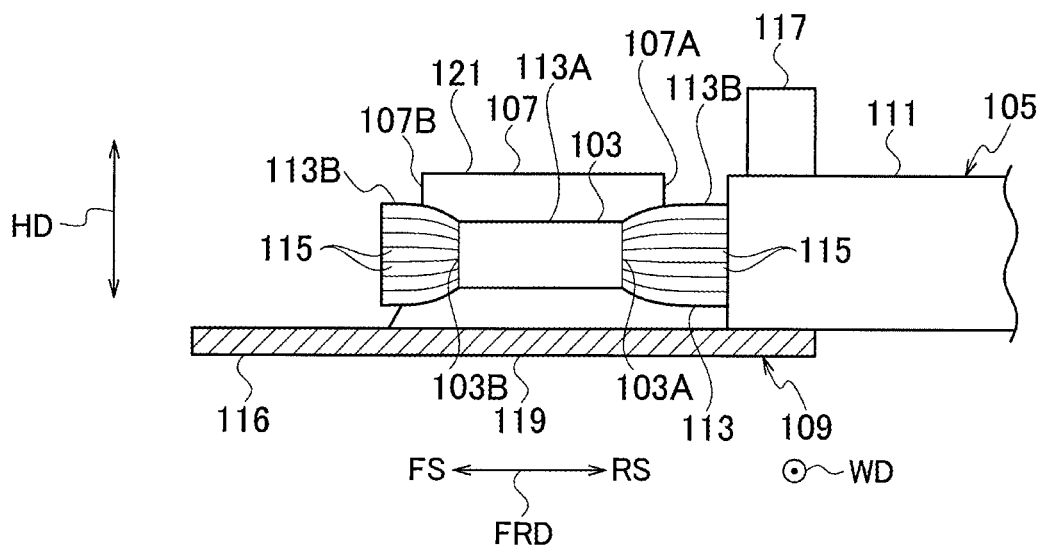
FIG. 14 is a view of a terminal-equipped electric wire according to a modification and shows a state before a terminal is installed on an electric wire.

In the above description, as shown in FIG. 13 and the like, the bonded portion 103 protrudes slightly forward from the front end 107B of the wire barrel 107. As shown in FIG. 14, the front end 107B of the wire barrel 107 may be located on the front side relative to the front end 103B of the bonded portion 103. That is, the dimension value of the wire barrel 107 in the front-rear direction is larger than the dimension value of the bonded portion 103 in the front-rear direction. In the front-rear direction, the bonded portion 103 may be located inside the wire barrel 107.

Also, in FIG. 14, the conductor 113B in the non-bonded state protrudes slightly forward from the front end 103B of the bonded portion 103. The conductor 113B in the non-bonded state protruding forward from the front end 103B of the bonded portion 103 may be eliminated.

According to the terminal-equipped electric wire 101 shown in FIG. 14, since the bonded portion 103 is located inside the wire barrel 107 in the front-rear direction, cut of the strands 115 at both ends (the rear end 103A and the front end 103B) of the bonded portion 103 can be suppressed.

Figure 15:
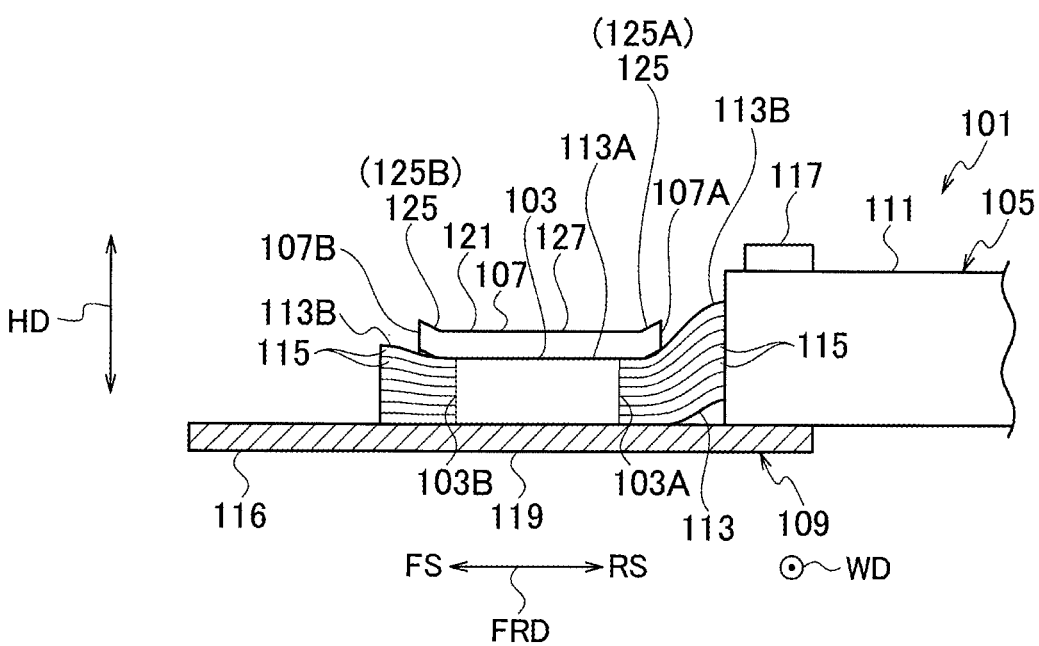
FIG. 15 is a cross-sectional view showing a schematic configuration of a terminal-equipped electric wire according to a modification.
Figure 16:
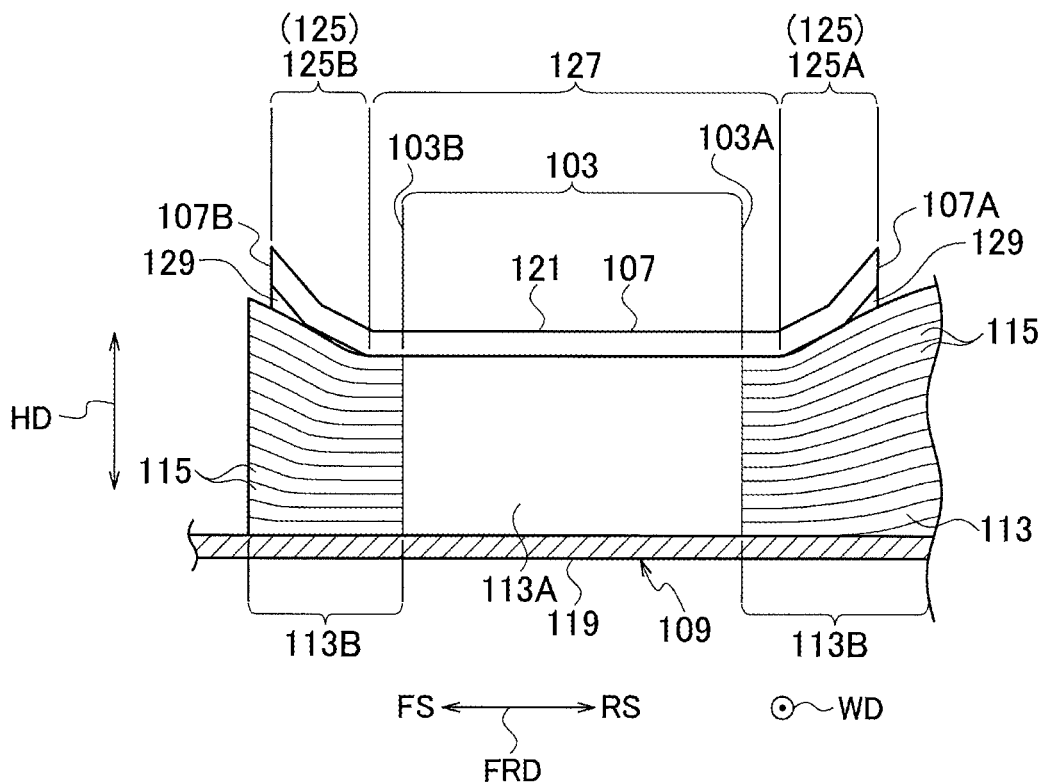
FIG. 16 is a view schematically showing the terminal-equipped electric wires of FIG. 15.
Figure 17:
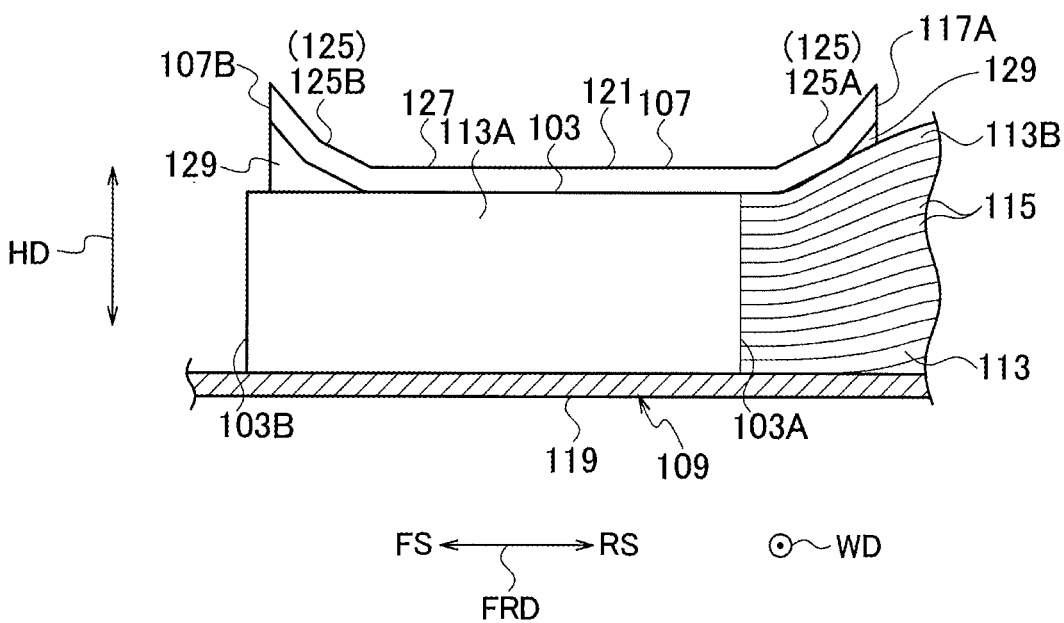
FIG. 17 is a view schematically showing a modification of the terminal-equipped electric wire of FIG. 15.

In the terminal-equipped electric wire 101 shown in FIGS. 11 to 14 the wire barrel 107 is not provided with a bell mouth portion. As shown in FIGS. 15 to 17, a bell mouth portion 125 may be provided on the wire barrel 107.

In this case, the bell mouth portion 125 is provided in a mode in which it protrudes rearward from the rear end 107A of the wire barrel 107 of the terminal-equipped electric wire 101 shown in FIGS. 11 to 14, and in a mode in which it protrudes forward from the front end 107B of the wire barrel 107 of the terminal-equipped electric wire 101 shown in FIGS. 11 to 14.

In the terminal-equipped electric wire 101 shown in FIGS. 15 and 16, the wire barrel 107 includes a main body portion 127 and a pair of bell mouth portions 125 (a rear bell mouth portion 125A and a front bell mouth portion 125B). In the front-rear direction, the front bell mouth portion 125B, the main body portion 127, and the rear bell mouth portion 125A are arranged in this order from the front side to the rear side.

More specifically, the bell mouth portion 125 (rear bell mouth portion 125A) is formed at an end portion (rear end portion) of the wire barrel 107 located on the sheath 111 side.

In the terminal-equipped electric wire 101 shown in FIGS. 15 and 16, the front end of the rear bell mouth portion 125A (the end opposite to the rear end located on the sheath 111 side in the front-rear direction; the boundary between the rear bell mouth portion 125A and the main body portion 127) is located on the sheath 111 side (rear side) relative to the rear end 103A (the end located on the sheath 111 side in the longitudinal direction) of the bonded portion 103.

In the terminal-equipped electric wire 101 shown in FIGS. 15 and 16, the main body portion 127 of the wire barrel 107 is formed in a cylindrical shape whose diameter is substantially constant in the front-rear direction. The rear bell mouth portion 125A is formed in a cylindrical shape having a gradually increasing diameter as it is farther from the main body portion 127 (from the front side toward the rear side). The diameter of the front end of the rear bell mouth portion 125A (the diameter at the boundary with the main body portion 127) is the same as the diameter of the main body portion 127.

In the terminal-equipped electric wire 101 shown in FIGS. 15 and 16, as in the rear bell mouth portion 125A, the front bell mouth portion 125B is formed in a cylindrical shape having a gradually increasing diameter as it is away from the main body portion 127 (from the rear side toward the front side).

In the terminal-equipped electric wire 101 shown in FIGS. 15 and 16, the dimension of the front bell mouth portion 125B in the front-rear direction and the dimension of the rear bell mouth portion 125A in the front-rear direction are smaller than the value of the height dimension of the bonded portion 103, and the dimension of the main body portion 127 in the front-rear direction of the wire barrel 107 is larger than the value of the height dimension of the bonded portion 103.

Further, in the terminal-equipped electric wire 101 shown in FIGS. 15 and 16, in the front-rear direction, the conductor 113 which is present between the main body portion 127 of the wire barrel 107 and the sheath 111 (the rear conductor 113B in the non-bonded state located between the front end of the rear bell mouth portion 125A and the sheath 111) has a height dimension and a diameter value which gradually become larger as they go rearward.

In the terminal-equipped electric wire 101 shown in FIGS. 15 and 16, from the front end of the bonded portion 103 of the electric wire 105, a conductor 113B (front conductor in a non-bonded state) in a non-bonded state protrudes forward by a predetermined length.

Consequently, with the terminal-equipped electric wire 101 shown in FIGS. 15 and 16, in the front-rear direction, the rear end (the boundary between the front conductor 113B in the non-bonded state and the bonded portion 103) of the front conductor 113B in the non-bonded state is located on the rear side relative to the rear end of the front bell mouth portion 125B, and the front end of the front conductor 113B in the non-bonded state is located on the front side relative to the front end of the front bell mouth portion 125B.

Further, as shown in FIG. 16, at the front end (opening at the front end) of the front bell mouth portion 125B, a slight gap 129 is formed between the conductor 113 (front conductor 113B in the non-bonded state) and the front bell mouth portion 125B, and a slight gap 129 is also formed between the conductor 113 and the rear bell mouth portion 125A at the rear end (opening at the rear end) of the rear bell mouth portion 125A.

At the front end (opening at the front end) of the front bell mouth portion 125B, the front bell mouth portion 125B and the conductor 113 may be in contact with each other, and the front bell mouth portion 125B may suppress the conductor 113. At the rear end (opening at the rear end) of the rear bell mouth portion 125A, the rear bell mouth portion 125A may be in contact with the conductor 113, and the rear bell mouth portion 125A may suppress the conductor 113.

In the terminal-equipped electric wire 101 shown in FIGS. 15 and 16, either the rear bell mouth portion 125A or the front bell mouth portion 125B may be eliminated. For example, the front bell mouth portion 125B may be eliminated. In this case, in the terminal-equipped electric wire 101, in the front-rear direction, the rear end of the front conductor 113B in the non-bonded state is located on the rear side relative to the front end of the main body portion 127 of the wire barrel 107.

According to the terminal-equipped electric wire 101 shown in FIGS. 15 and 16, the bonded portion 103 is located inside the main body portion 127 (the main body portion excluding the bell mouth portion 125) of the wire barrel 107. Thus, cut of the conductor 113 when the terminal 109 is installed in the electric wire 105 can be suppressed.

Further, according to the terminal-equipped electric wire 101 shown in FIG. 15 and FIG. 16, since part (a portion on the bonded portion 103 side) of the conductor 113B in the non-bonded state is contained within the bell mouth portion 125, it is possible to further suppress cut of the conductor 113 at the boundary portion between the bonded portion 103 and the conductor 113B in the non-bonded state.

In the terminal-equipped electric wire 101 shown in FIGS. 15 and 16 in which the bell mouth portion 125 is provided, the bonded portion 103 is located inside the main body portion 127 of the wire barrel 107. However, in the front-rear direction, the front end of the bonded portion 103 may be located in the intermediate portion of the front bell mouth portion 125B, and the rear end of the bonded portion 103 may be located in the intermediate portion of the rear bell mouth portion 125A.

Further, as shown in FIG. 17, a configuration in which the front conductor 113B in the non-bonded state is eliminated may be employed. In the terminal-equipped electric wire 101 shown in FIG. 17, the front end of the bonded portion 103 is located on the front side relative to the front end of the front bell mouth portion 125B. The front end of the bonded portion 103 may be located on the rear side relative to the rear end of the front bell mouth portion 125B, and the front end of the bonded portion 103 may be located at the front bell mouth portion 125B.

Figure 18:
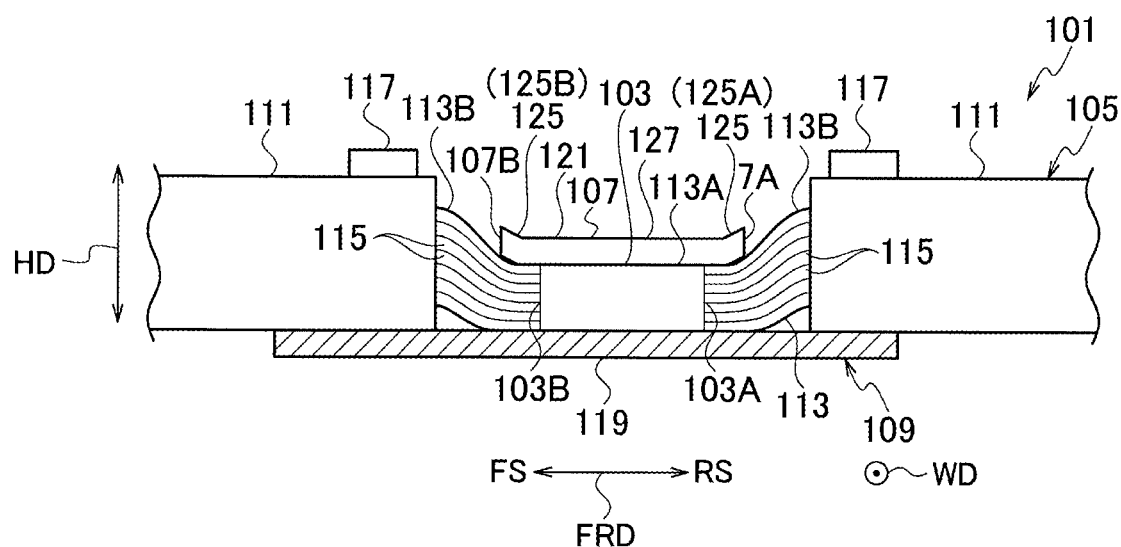
FIG. 18 is a view of a terminal-equipped electric wire according to a modification in which a bonded portion is formed at an intermediate portion in the longitudinal direction of the electric wire and a terminal is installed thereon.

In the above description, the bonded portion 103 is formed at one end portion in the longitudinal direction of the electric wire 105, and the terminal 109 is installed therein. However, as shown in FIG. 18, the bonded portion 103 may be formed at the intermediate portion of the electric wire 105 in the longitudinal direction, and the terminal 109 may be installed therein.

More specifically, the terminal 109 may be installed at the bonded portion 103 of the electric wire in which, from one side of the electric wire 105 in the longitudinal direction to the other side, the conductor 113 (one end side portion of the electric wire in which the sheath is present) covered with the sheath 111, the conductor 113B (conductor in a non-bonded state on one end side) in the non-bonded state, bonded portion 103, a conductor 113B (conductor in the non-bonded state on the other end side) in the non-bonded state, and the conductor 113 covered with the sheath 111 (the other end side portion of the electric wire in which the sheath is present) are arranged in this order.

In such a terminal-equipped electric wire, in the longitudinal direction of the electric wire 105 (the front-rear direction of the terminal 109), the value of the length dimension of the wire barrel 107 (or the main body portion 127 of the wire barrel) of the terminal 109' is larger than the value of the length dimension of the bonded portion 103, and, in the longitudinal direction of the electric wire 105 (the front-rear direction of the terminal 109), the bonded portion 103 is located inside the wire barrel 107 (or the main body portion 127 of the wire barrel) of the terminal 109.

Figure 19:
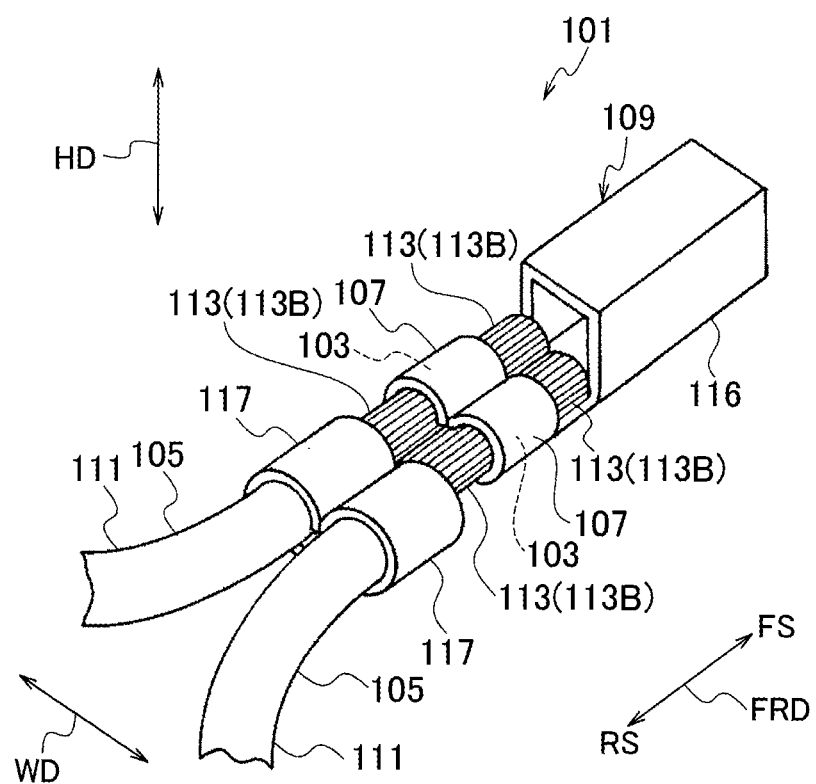
FIG. 19 is a view a terminal-equipped electric wire according to a modification in which one terminal is installed on a plurality of (for example, two) electric wires.

Furthermore, in the above description, one terminal 109 is provided on one electric wire 105. As shown in FIG. 19, one terminal 109 may be provided for a plurality of (for example, two) electric wires 105. That is, as in the case described above, the wire barrel 107 may be installed at the bonded portion 103 of each electric wire 105 so that the bonded portion 103 of each electric wire 105 is placed inside the wire barrel 107 (or the main body portion 127 of the wire barrel) of one terminal 109.

Further, when one terminal 109 is installed on a plurality of electric wires 105, the bonded portion 103 may be individually formed on the conductor 113 of each electric wire 105 and one terminal 109 may be provided for each electric wire 105. The conductors 113 of at least two the electric wires 105 among the electric wires 105 may be collected, the bonded portion 103 may be formed on the collected conductors, and one terminal 109 may be provided for each electric wire 105.

Further, when one terminal 109 is installed for a plurality of electric wires 105, with at least one electric wire 105 among the electric wires 105, the bonded portion 103 may be formed at an intermediate portion of the electric wire 105 in the longitudinal direction.

Embodiments of the present invention have been described above. However, the invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

Moreover, the effects described in the embodiments of the present invention are only a list of optimum effects achieved by the present invention. Hence, the effects of the present invention are not limited to those described in the embodiment of the present invention.

What is claimed is:

1. An ultrasonic bonding method comprising:
   forming a single bonded portion by ultrasonically bonding strands, constituting a conductor of at least one electric wire, using an anvil and horns, the ultrasonically bonding comprising vibrating the horns at a same time,
   wherein a first vibration mode of at least one of the horns is different from a second vibration mode of the other horns.

2. The ultrasonic bonding method according to claim 1, wherein the first vibration mode and the second vibration mode are different from each other in at least one of a frequency, a phase, a waveform, or an amplitude.

3. The ultrasonic bonding method according to claim 1, wherein
   the at least one electric wire comprises electric wires, and
   the strands of the electric wires are ultrasonically bonded to each other.

4. The ultrasonic bonding method according to claim 1, wherein
   the horns have respective conductor contact bodies in contact with the strands of the at least one electric wire,
   the conductor contact bodies of the horns are configured to vibrate with a single ultrasonic transducer, and
   at least one of the conductor contact bodies and the other conductor contact bodies are different from each other in at least one of a material or a shape.

5. A method of manufacturing a terminal-equipped electric wire, the method comprising:
   by using the ultrasonic bonding method of the conductor of the at least one electric wire according to claim 1, forming the single bonded portion by bonding the conductor at a part of an exposed portion of the conductor in a longitudinal direction of the at least one electric wire, the exposed portion at which the conductor is exposed due to absence of a sheath over a predetermined length at a part of the at least one electric wire in the longitudinal direction; and
   after forming the single bonded portion, installing a terminal with a wire barrel on the at least one electric wire such that the wire barrel covers at least a part of the single bonded portion with an end of the wire barrel on a sheath side of the at least one electric wire being located closer to the sheath than an end of the single bonded portion on the sheath side.

6. The method of manufacturing a terminal-equipped electric wire according to claim 5, wherein
   the longitudinal direction and a front-rear direction of the wire barrel match with each other, and
   the single bonded portion is located inside the wire barrel in the front-rear direction.

7. The ultrasonic bonding method according to claim 1, wherein respective inner surfaces of the horns, that are configured to contact the strands, face in a same direction.

8. The ultrasonic bonding method according to claim 1, wherein the at least one electric wire is a single electric wire.

9. An ultrasonic bonding method, the method comprising:
   ultrasonically bonding strands forming a conductor of an electric wire using an anvil and horns,
   wherein a first vibration mode of at least one of the horns is different from a second vibration mode of the other horns,
   the horns have respective conductor contact bodies in contact with the strands of the electric wire,
   the conductor contact bodies of the horns are configured to vibrate with a single ultrasonic transducer, and
   at least one of the conductor contact bodies and the other conductor contact bodies are different from each other in at least one of a material or a shape.

* * * * *